(12) United States Patent
Yasuda et al.

(10) Patent No.: US 7,851,817 B2
(45) Date of Patent: Dec. 14, 2010

(54) SILICON LED PACKAGE HAVING HORN AND CONTACT EDGE WITH (111) PLANES

(75) Inventors: Yoshiaki Yasuda, Yokohama (JP); Yoshiro Sato, Sapporo (JP)

(73) Assignee: Stanley Electric Co., Ltd., Tokyo (JP)

( * ) Notice: Subject to any disclaimer, the term of this patent is extended or adjusted under 35 U.S.C. 154(b) by 589 days.

(21) Appl. No.: 11/881,222

(22) Filed: Jul. 26, 2007

(65) Prior Publication Data

US 2009/0026472 A1    Jan. 29, 2009

(30) Foreign Application Priority Data

Jul. 27, 2006   (JP)   ............... 2006-204833

(51) Int. Cl.
*H01L 33/00*   (2010.01)
(52) U.S. Cl. .......................... 257/98; 257/99
(58) Field of Classification Search ........... 257/76–103, 257/E33.057, E33.059, E33.065, E33.072
See application file for complete search history.

(56) References Cited

U.S. PATENT DOCUMENTS

| | | | | |
|---|---|---|---|---|
| 6,583,444 B2 * | 6/2003 | Fjelstad | ............... | 257/100 |
| 7,732,233 B2 * | 6/2010 | Lin et al. | ............... | 438/28 |
| 2009/0273004 A1 * | 11/2009 | Lin et al. | ............... | 257/99 |
| 2009/0289272 A1 * | 11/2009 | Kim et al. | ............... | 257/98 |

FOREIGN PATENT DOCUMENTS

JP   2005-277380 A   10/2005

* cited by examiner

*Primary Examiner*—Cuong Q Nguyen
(74) *Attorney, Agent, or Firm*—Holtz, Holtz, Goodman & Chick, PC

(57) ABSTRACT

A (100) silicon substrate is prepared having an insulating film formed on front and back surfaces of the silicon substrate. A resist pattern is formed on the insulating film and partially etched to form an etching mask on the front and back surfaces. The silicon substrate is subjected to anisotropical etching dependent upon an orientation to form a concave horn and a through hole, the concave horn having a bottom with a (100) plane and four inclined sidewalls with a (111) plane, and the through hole gradually narrowing from the front and back surfaces toward an inside of the silicon substrate and having a bottleneck portion with the (111) plane at an intermediate position in the silicon substrate. An LED chip is mounted on the bottom of the concave horn to form an LED package. The LED package is provided which presents high wiring reliability and simplified manufacture processes.

20 Claims, 9 Drawing Sheets

FIG. 10

SILICON LED PACKAGE HAVING HORN AND CONTACT EDGE WITH (111) PLANES

CROSS REFERENCE TO RELATED APPLICATION

This application is based on and claims priority of Japanese Patent Application No. 2006-204833 filed on Jul. 27, 2006, the entire contents of which are incorporated herein by reference.

BACKGROUND OF THE INVENTION

A) Field of the Invention

The present invention relates to a semiconductor light emitting device, and more particularly to a package for mounting an LED, a light emitting apparatus using the package and the manufacture method thereof.

B) Description of the Related Art

Various proposals have been made to Incorporate a light reflection structure on an LED package to improve an external light output efficiency. JP-A-2005-277380, the whole contents of which are incorporated herein by reference, proposes an LED including a concavity formed in a silicon substrate by liquid phase etching, at least two electrodes formed in the concavity, and at least one LED chip mounted on the concavity and electrically connected to the electrodes.

Improvements in the external light output efficiency and reliability of electrode wirings, with simplified manufacture processes are required recently in LED packages.

SUMMARY OF THE INVENTION

An object of this invention is to provide an LED package of good quality and a method for manufacturing the same.

Another object of this Invention is to provide a silicon package having a reflection structure and a high reliability of electrode wirings and a method for manufacturing the same with simplified processes.

According to one aspect of the present invention, there is provided a method for manufacturing a silicon package adapted for mounting an LED comprising the steps of:

(a) preparing a (100) silicon substrate having insulating films formed on front and back surfaces of said silicon substrate;

(b) forming resist patterns on said insulating films and partially etching said insulating films to form etching masks on the front and back surfaces, the etching mask on the front surface having a rectangular aperture defined by sides along [110] directions of said silicon substrate for forming a concave horn and a first shaped aperture defined by sides along [110] directions of said silicon substrate for forming a through hole or a contact edge, the etching mask on the back surface having a second shaped aperture defined by sides along [110] directions of said silicon substrate for forming the through hole or contact aperture, registered with the first shaped aperture; and (c) subjecting said silicon substrate to anisotropic etching dependent upon crystallographic orientation to form a concave horn and a through hole or contact edge, said concave horn having a bottom surface formed of (100) plane and four inclined side surfaces formed of (111) planes, and said through hole or contact edge having side surfaces formed of (111) planes, extending from said front and back surfaces and meeting at an intermediate height of said silicon substrate.

According to another aspect of the present invention, there is provided a silicon package adapted for mounting an LED, comprising:

a silicon substrate having front and back surfaces;

a concave horn formed from the front surface to an intermediate depth in said silicon substrate, the concave horn having a bottom with a (100) plane and four inclined sidewalls with (111) planes; and at least one through hole or contact edge formed through said silicon substrate, outside said concave horn, the through hole or contact edge having inclined side surfaces formed of (111) planes, extending from said front and back surfaces and meeting at an intermediate height of said silicon substrate.

According to further aspect of the invention, there is provided a method for manufacturing an LED package comprising the steps of:

(a) preparing a (100) silicon substrate having insulating films formed on front and back surfaces of said silicon substrate;

(b) forming resist patterns on said insulating films and partially etching said insulating films to form etching masks on the front and back surfaces, the etching mask on the front surface having a rectangular aperture defined by sides along [110] directions of said silicon substrate for forming a concave horn and a first shaped aperture defined by sides along [110] directions of said silicon substrate for forming a through hole or a contact edge, the etching mask on the back surface having a second shaped aperture defined by sides along [110] directions of said silicon substrate for forming the through hole or contact aperture, registered with the first shaped aperture;

(c) subjecting said silicon substrate to anisotropic etching dependent upon crystallographic orientation to form a concave horn and a through hole or contact edge, said concave horn having a bottom surface formed of (100) plane and four inclined side surfaces formed of (111) planes, and said through hole or contact edge having side surfaces formed of (111) planes, extending from said front and back surfaces and meeting at an intermediate height of said silicon substrate;

(d) depositing metal films on the front and back surfaces of said silicon substrate including said concave horn and said through hole or contact edge; and (e) mounting an LED chip on said metal film at the bottom of said concave horn.

According to another object of this invention there is provided an LED package comprising:

a silicon substrate having front and back surfaces;

a concave horn formed from the front surface to an intermediate depth in said silicon substrate, the concave horn having a bottom with a (100) plane and four inclined sidewalls with (111) planes;

at least one through hole or contact edge formed through said silicon substrate, outside said concave horn, the through hole or contact edge having inclined side surfaces formed of (111) planes, extending from said front and back surfaces and meeting at an intermediate height of said silicon substrate; and at least one LED chip mounted on the bottom of said concave horn.

According to another object of this invention, there is provided a lighting apparatus including an LED package, the LED package comprising:

a silicon substrate having front and back surfaces;

a concave horn formed from the front surface to an intermediate depth in said silicon substrate, the concave horn having a bottom with a (100) plane and four inclined sidewalls with (111) planes;

at least one through hole or contact edge formed through said silicon substrate, outside said concave horn, the through hole or contact edge having inclined side surfaces formed of (111) planes, extending from said front and back surfaces and meeting at an intermediate height of said silicon substrate; and at least one LED chip mounted on the bottom of said concave horn.

DESCRIPTION OF THE PREFERRED EMBODIMENTS

With reference to FIGS. 1A to 1I, description will be made on a manufacture method for an LED package according to the first embodiment. FIGS. 1A to 1I are cross sectional views illustrating steps of a method for manufacturing an LED package according to the first embodiment of this invention.

Figure 1A:
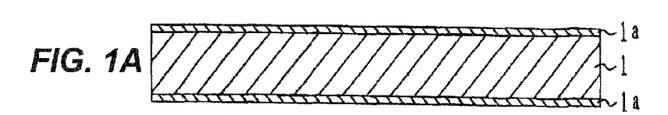
FIGS. 1A to 1I are cross sectional views illustrating a manufacture method for an LED package according to a first embodiment.

As shown in FIG. 1A, as a base body for mounting an LED chip, a (100) single crystal silicon substrate 1 is used, having a thickness of 525 μm. The surface of the single crystal silicon substrate 1 is planarized by chemical mechanical polishing. First, a silicon oxide film 1a having a thickness of 500 nm is formed on front and back surfaces of the silicon substrate 1 by thermal oxidation in a diffusion furnace.

Figure 1B:
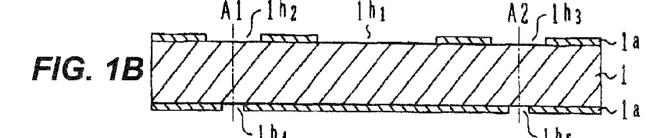

As shown in FIG. 1B, resist patterns having rectangular openings, each defined by sides along [110] directions of the silicon surface is formed on the silicon oxide films 1a by photolithography. The silicon oxide films 1a are partially etched by buffered hydrofluoric acid (BHF) to form patterns of silicon oxide films with openings on the back and front surfaces. In the example shown, three openings (an opening $1h_1$ at a central area, and right and left openings $1h_2$ and $1h_3$ spaced from the opening $1h_1$) are formed on the front surface, and two openings $1h_4$ and $1h_5$ are formed on the back surface. The opening $1h_2$ (or $1h_3$) on the front surface has a similar figure to, and is registered with, that of the opening $1h_4$ (or $1h_5$) on the back surface, one upon the other.

Figure 1C:
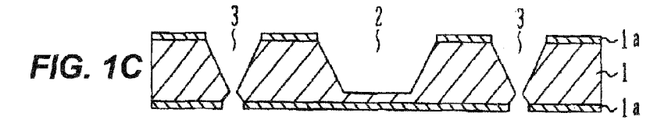

As shown in FIG. 1C, by using the silicon oxide film patterns 1a as etching masks, the silicon substrate 1 is anisotropically etched by, for example, 25% tetramethylammonium hydroxide (TMAH) solution. In this embodiment, the surfaces of the silicon substrate 1 have the (100) plane, and TMAH solution has a fast etching rate relative to the (111) plane. Therefore, etching progresses from the (100) plane along directions other than [111] direction, so that the (111) planes are exposed. Since the sidewall of the opening is in the [110] directions, four (111) inclined sidewalls appear. With this anisotropic etching, a concavity (concave horn) 2 and through holes 3 are formed in and through the silicon substrate 1, respectively.

The through hole 3 will be described. As the (100) plane at the bottom of the opening 1 ha on the front surface is anisotropically etched, the (111) plane is hardly etched leaving the inclined (111) sidewalls, and etching the (100) plane progresses. Similarly, anisotropic etching of the (100) plane at the bottoms of the openings $1h_2$ and $1h_3$ progresses leaving the (111) planes. Anisotropic etching of the (100) plane at the bottoms of the openings $1h_4$ and $1h_5$ on the back surface progresses toward the upper portion of the substrate, leaving the (111) plane. As the etching progresses from the front and back surfaces along a direction parallel to one-dot chain lines A1 and A2, the front side and back side etchings meet at an intermediate depth of the silicon substrate to form through holes. The through hole 3 becomes narrow toward the inside of the substrate from the front and back surfaces, and forms a bottleneck portion at the intermediate depth of the substrate in a thickness direction. Etching is stopped when the through hole 3 is formed. In this manner, the substrate for mounting an LED chip is formed.

The bottleneck portion is a rectangular opening surrounded by the (111) planes. The position of the bottleneck portion can be adjusted by adjusting the sizes of the opening $1h_2$ ($1h_3$) on the front surface and the opening $1h_4$ ($1h_5$) on the back surface of the silicon substrate. Namely, as the opening $1h_4$ ($1h_5$) on the bottom surface is narrowed, etching of the (100) plane at the bottom of the opening $1h_4$ ($1h_5$) on the back surface is terminated faster than etching of the (100) plane at the bottom of the opening $1h_2$ ($1 h_3$) on the front surface, to thereby stop the progress of etching. It is possible to adjust the position of the bottleneck by an etching depth.

Since etching from the opening $1h_1$ progresses at generally the same rate as that of etching from the openings $1h_2$ and $1h_3$, this etching from the opening $1h_1$ terminates without passing through the substrate to form the concave horn 2. Here, the concave horn has an inverted truncated pyramid shape, with four (111) indined sidewalls, and one (100) top surface. The concave horn 2 is trapezoidal in its vertical cross section, and rectangular in its horizontal cross section. Namely, the concave horn 2 is constituted of the bottom having the (100) plane and four inclined sidewalls having the (111) plane. The inclined sidewall having the (111) plane has an inclination angle of 54.7° relative to the bottom having the (100) plane.

The bottom of the concave horn 2 and the position of the bottleneck portion of the through hole 3 in the thickness direction is usually flush (at the same level) with each other, or the bottleneck portion is somewhat nearer to the front surface of the silicon substrate than the bottom. As shown in FIG. 1C, it is preferable that a distance from the bottleneck in the through hole 3 to the front surface of the silicon substrate is longer than a distance from the bottleneck to the back surface of the silicon substrate, to realize a larger or deeper horn. A thickness of the silicon substrate at the bottom of the concave horn is preferably thin in order to more effectively radiate the heat generated by an LED chip 5 to be mounted on the bottom of the concave horn 2.

Figures 1D, 1E:
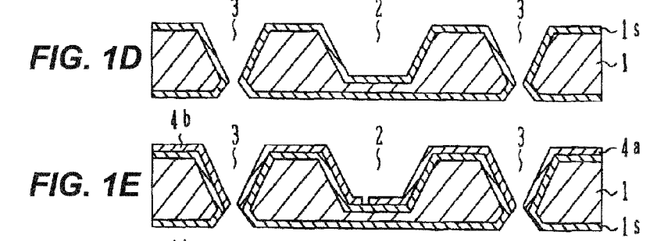

As shown in FIG. 1D, the silicon oxide film patterns 1a are removed, and a silicon oxide film 1s is again formed on the whole surface of the silicon substrate 1 by thermal oxidation.

As shown in FIG. 1E, a barrier film made of Ti, Cu, Ni, Pt or the like is formed by sputtering or the like on the silicon oxide film 1s on the front surface of the silicon substrate 1. Next, a reflection film of Ag, Au, Al, their alloy or the like is formed on the barrier layer. A resist pattern having a stripe slit is formed on the reflection film. By using this resist pattern as a mask, the metal barrier layer and reflection film is selectively etched to form patterned reflection films/electrodes 4a and 4b on the front surface of the silicon substrate 1.

Figure 1F:
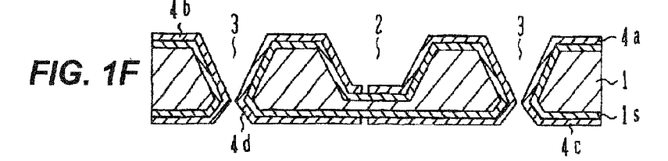

As shown in FIG. 1F, similar processes of metal deposition and patterning to the above-described processes are performed for the back surface to form electrodes 4c and 4d. The electrodes 4c and 4d do not serve as reflection films, and hence may be made of different material from the electrodes/reflection films 4a and 4b. The reflection films/electrodes 4a and 4b patterned on the front surface of the silicon substrate are connected to the electrodes 4c and 4d patterned on the back surface, respectively, via the bottleneck portions to establish conduction of the wiring portions. In a conventional example, a wiring led to the back surface includes an acute angle edge. Therefore, an electrode film formed by sputtering is likely to be broken at the edge portion. However, in this embodiment, the bottleneck portion has an obtuse angle (e.g. 54.7×2=109.4 degrees). Wire breaking becomes rare or difficult.

As a patterning method, a "lift-off" method may be used by which a resist pattern is formed on the silicon oxide film 1s, barrier layers and reflection films are formed thereon, and lastly the barrier layers and reflection films laminated on the resist pattern are removed together with the resist pattern to thereby pattern the barrier layers and reflection films.

We call the silicon substrate shown in FIG. 1F "a silicon package", having a concave horn, through holes and electrode patterns.

Figure 1G:
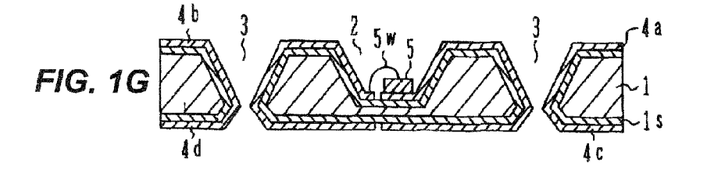

As shown in FIG. 1G, a lower electrode of the LED chip 5 is die-bonded to the reflection film/electrode 4a defined on the bottom of the concave horn. The LED chip 5 is a monochromatic LED having an emission color of red (R), green (G) or blue (B). For example, for a red LED, aluminum gallium arsenic (AlGaAs) is used as the material of an active semiconductor layer. For a green LED, gallium phosphorus (GaP) is used, and for a blue LED, gallium nitride (GaN) is used.

Figure 2:
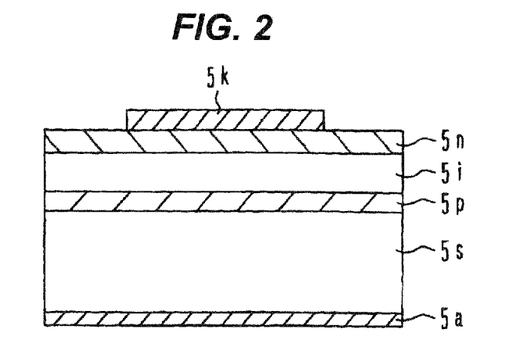
FIG. 2 is a cross sectional view showing the structure of an LED chip.

FIG. 2 is a schematic cross sectional view showing the structure of the LED chip 5. A red LED chip has, for example, the structure that semiconductor layers (a p-type semiconductor layer 5p, a light emission layer 5i and an n-type semiconductor layer 5n) are sequentially laminated in this order on a gallium arsenide (GaAs) substrate 5s, and metal electrodes 5a and 5k are formed on the lowermost and uppermost surfaces respectively, as shown in FIG. 2. For a green LED chip, GaP or the like is used as the material of the substrate, semiconductor layers are laminated on the GaP substrate, and metal electrodes are formed on the lowermost and uppermost surfaces, in the manner similar to that of the red LED chip. For a blue LED chip, for example, the structure is adopted which is described in JP-A-2005-167319, the whole contents of which is incorporated herein by reference. As the lower electrode of the LED chip 5 having this structure is die-bonded (e.g., Au—Sn eutectic bonding), the reflection film/electrode 4a and LED chip 5 are electrically and mechanically connected. Solder reflow, silver paste or the like may be used for die bonding of the LED chip 5.

Figure 1H:
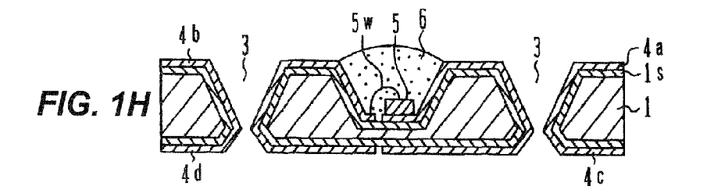

The upper electrode of the LED chip 5 and the reflection film/electrode 4b are electrically connected by wire bonding using a bonding wire 5w of Au or the like. The reflection films/electrode 4a and 4b extending from the bottom through inclined sidewalls of the concave horn, to the front surface, are electrically connected to the electrodes 4c and 4d on the back surface As shown in FIG. 1H, the inside of the concave horn 2 is molded with transparent resin 6. In manufacturing a white LED, a blue LED may be used as the LED chip 5 and fluorescent phosphor for wavelength transfer may be added to the transparent resin 6. Before the resin is cured, an optical lens prepared beforehand and having the size inclusive of the concave horn opening may be disposed above the concave horn to form an LED package with an optical lens.

Figure 1I:
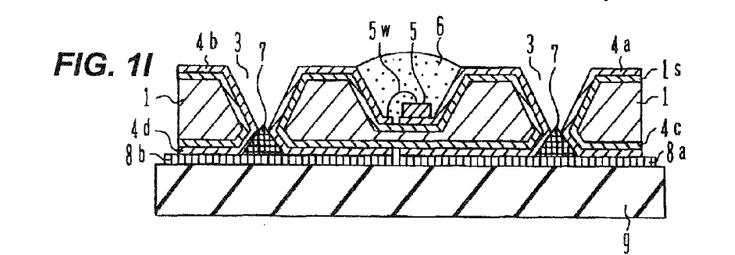

As shown in FIG. 1I, the electrodes 4c and 4d are electrically connected to Cu wiring patterns 8a and 8b on an external circuit board (printed wiring board) 9 with adhesive 7. The adhesive 7 may be cream solder reflow. An LED package is completed in this way.

Figure 3:
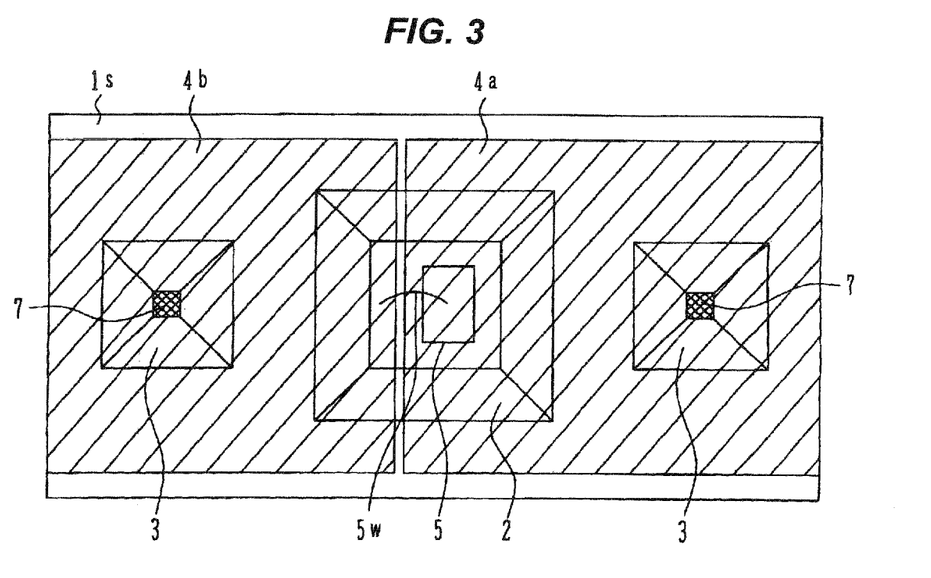
FIG. 3 is a plan view of an LED package of the first embodiment.

FIG. 3 is a plan view of the LED package of this embodiment. As viewed from the upside, the silicon substrate of the LED package of this embodiment is formed with the concave horn 2 and two through holes 3. In FIG. 3, the bottleneck portion of the through hole has a square opening. The electrodes 4a and 4b divided on the bottom of the concave horn 2 continuously extend on the right and left through holes 3 via on the silicon substrate front surface.

For the LED package of the embodiment, the concave horn for mounting an LED chip and the through holes for connection to a circuit board can be formed by single anisotropic etching so that manufacture processes can be simplified. When the LED package is connected to the circuit board, soldering is performed in a region gradually broadening its width from the bottleneck portion of the through hole to the silicon substrate back surface. It is therefore advantageous in that the connection area is broadened and a connection strength can be enhanced. Since the connection region between the electrode 4a (4b) and electrode 4c (4d) has an abuse angle, contact defects of the connection region are hard to occur so that wiring reliability can be improved.

It is also possible to etch the front surface and back surface separately. Also in this case, etching of the concave horn and through holes can be done in common.

With reference to FIGS. 4A to 4K, description will be made on an LED package manufacture method according to the second embodiment.

As shown in FIGS. 4A to 4F, similar processes to those of the first embodiment are performed for the processes up to laminating electrodes on a silicon substrate 1 having silicon oxide films 1s formed on the surfaces thereof.

Figure 4A:
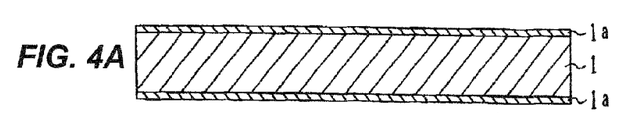
FIGS. 4A to 4K are cross sectional views illustrating a manufacture method for an LED package according to a second embodiment.
Figure 4B:
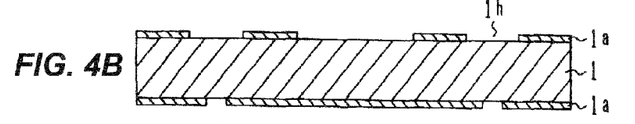
Figure 4C:
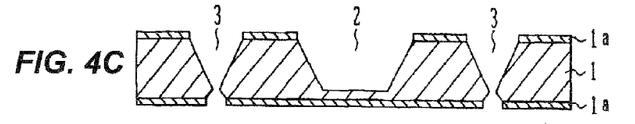
Figure 4D:
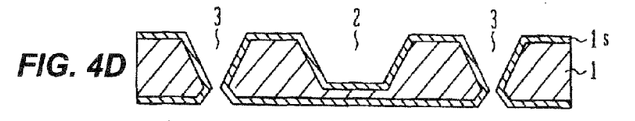
Figure 4E:
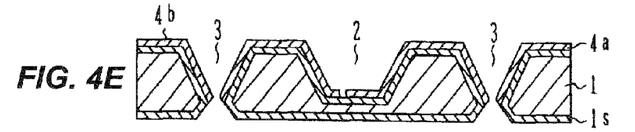
Figure 4F:
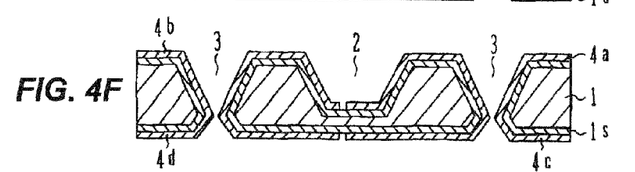
Figure 4G:
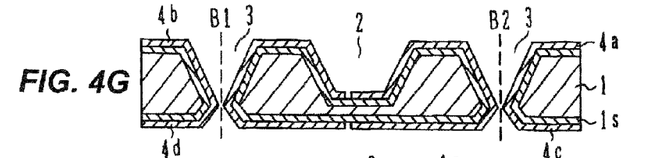
Figure 4H:
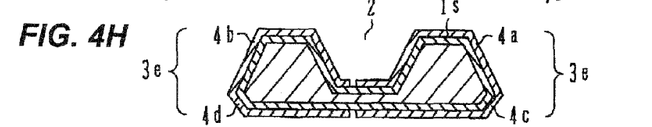

As shown FIGS. 4G and 4H, the substrate is cut along cut planes B1 and B2 passing along the side near the concave horn 2, of the bottleneck portions of the through holes 3. A concave horn 2 and contact edges 3e which is formed by dividing the through holes 3 are left on the silicon substrate 1. The contact edge 3e includes an upper groove and a lower groove each made of three (111) planes, the grooves meeting at an apex at an intermediate height of the substrate.

We call the silicon substrate shown in FIG. 4H "a silicon package", similar to the silicon substrate shown in FIG. 1F.

Figure 4I:
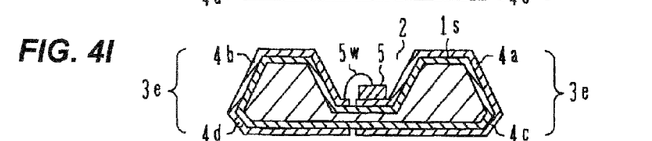
Figure 4J:
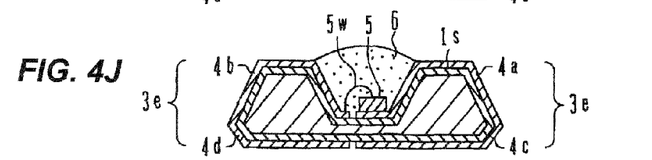
Figure 4K:
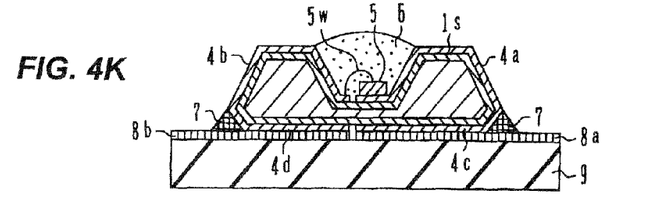

As shown in FIGS. 4I to 4K, similar to the first embodiment, an LED chip 5 is mounted, and copper wiring patterns 8a and 8b on a circuit board 9 are connected to electrodes 4c and 4d to complete an LED package. For example, connection is done by solder reflow at a groove portion under the apex of the contact edge 3e. Similar to the first embodiment, a connection area is broadened and a connection strength can be enhanced.

Figure 5:
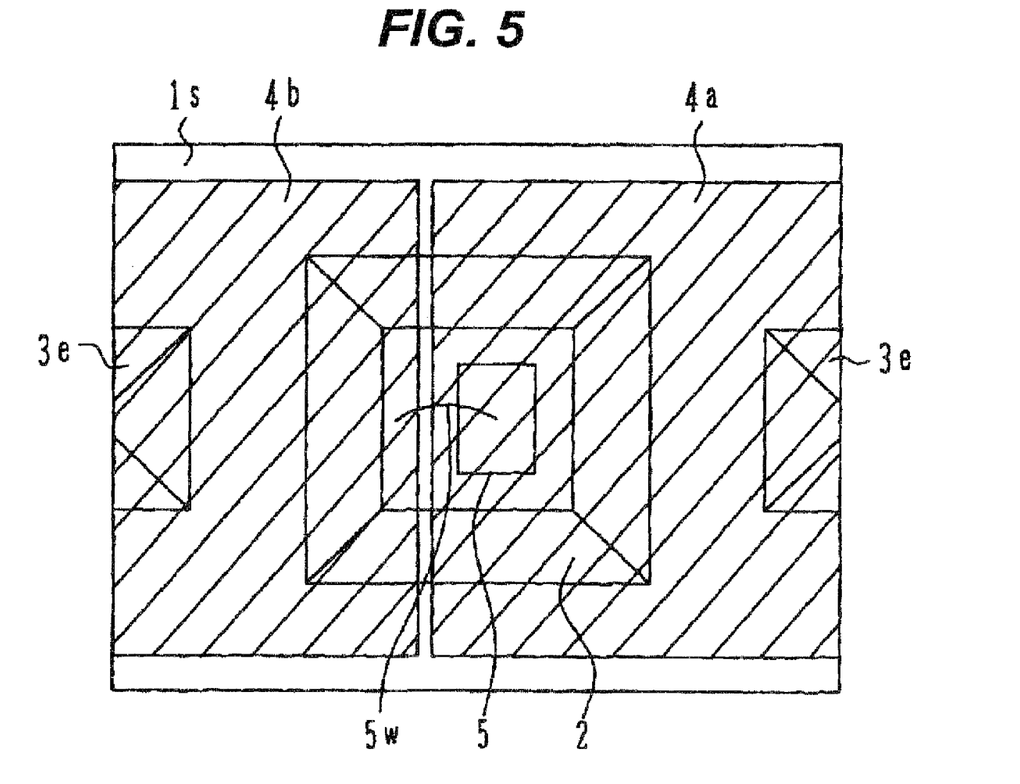
FIG. 5 is a plan view of the LED package of the second embodiment.

FIG. 5 is a plan view of the LED package of the second embodiment. The LED package has the concave horn in the central area and right and left contact edges each including upper and lower grooves constituted of three (111) planes. The three (111) planes at the back surface on the right and left sides serve as a contact edge 3e. By dicing the silicon substrate, an LED package can be manufactured which is more compact than the first embodiment.

Figure 6:
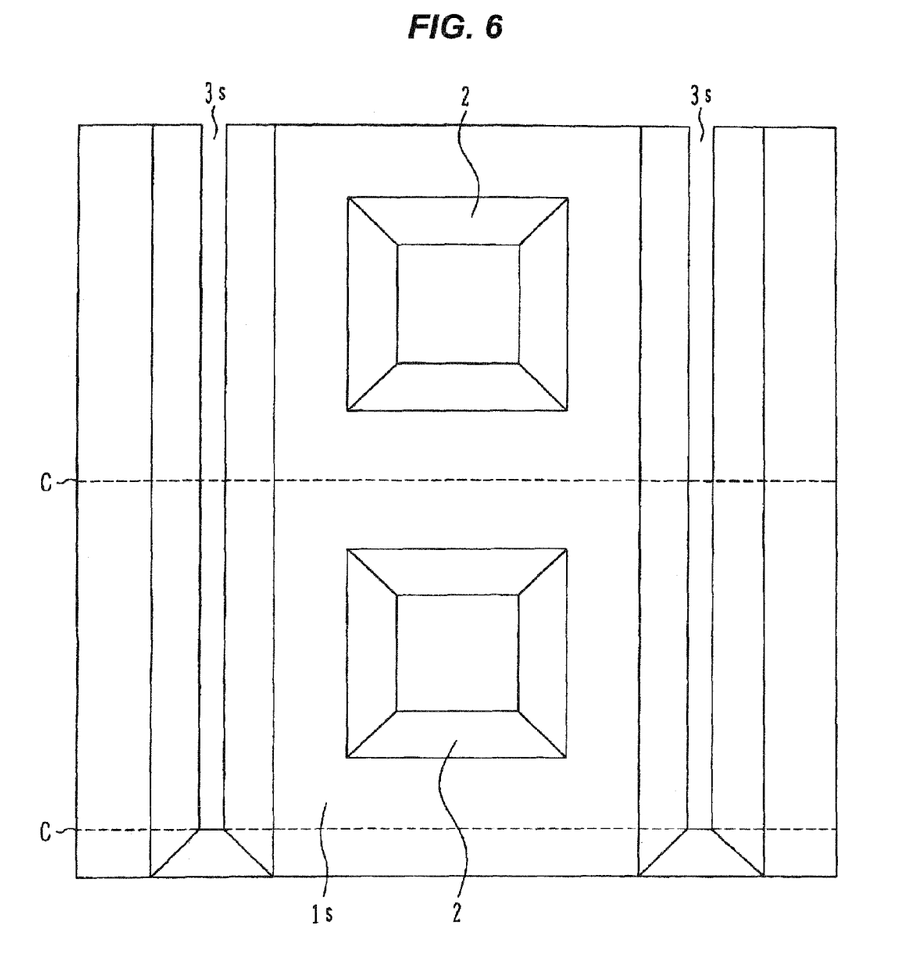
FIG. 6 is a plan view showing etching positions of a silicon substrate according to a modification of the second embodiment.

FIG. 6 is a plan view showing a modification of the second embodiment. As shown in FIG. 6, In order to form a plurality of packages from one silicon substrate, slits 3s passing through the packages are formed along sides where contact edges are formed and the substrate is diced along dotted lines C crossing the slits. It is therefore possible to form a package having a contact edge 3e having upper and lower side surfaces of (111) plane, meeting at a border to form an apex, at each of a pair of opposing sides. In this modification, the connection area relative to a circuit board can be broadened so that connection is easy and the resistance of the connection becomes low.

Figure 7:
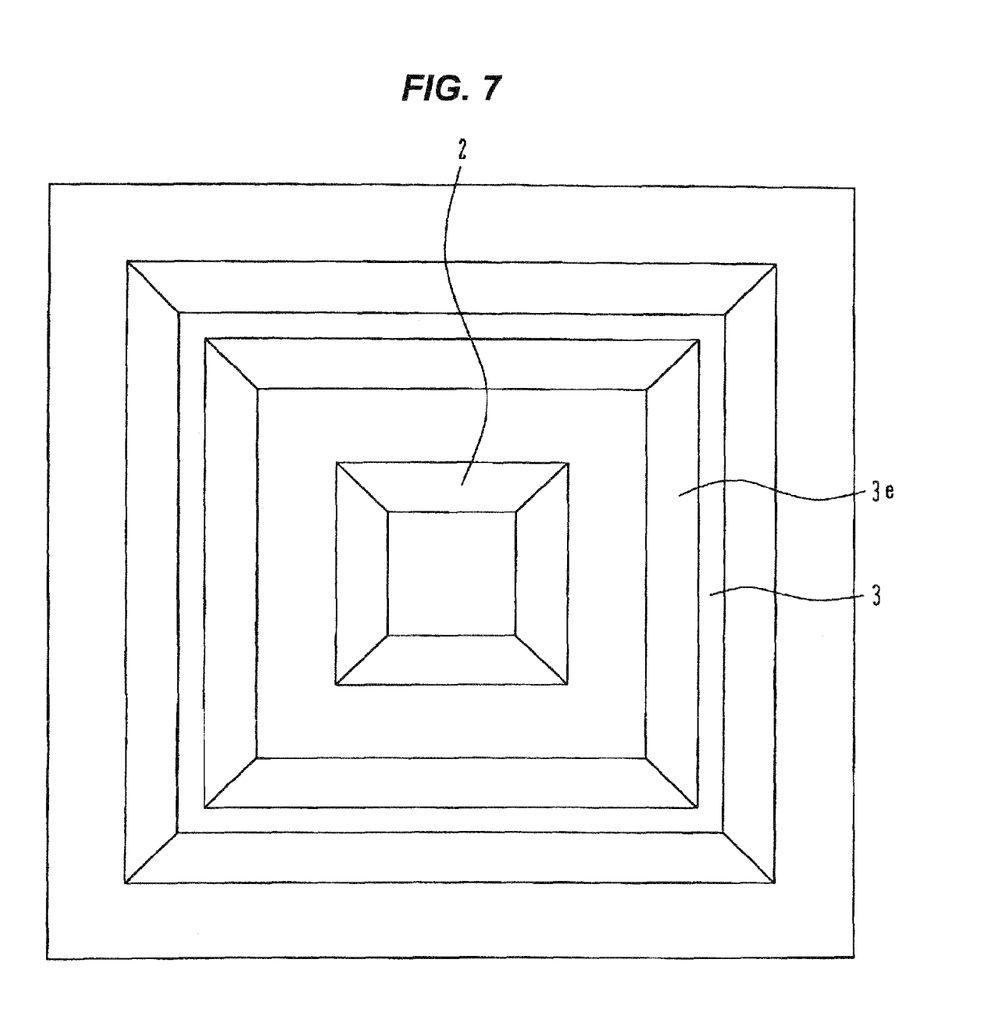
FIG. 7 is a plan view showing etching positions of a silicon substrate according to another modification of the second embodiment.

FIG. 7 is a plan view of another modification of the second embodiment. As shown in FIG. 7, a loop shaped through hole 3 surrounding a concave horn 2 may be formed by changing an etching mask pattern. In this case, the opening of the through hole 3 separates the silicon substrate including the concave horn 2. The (111) sidewall of the through-hole 3 on the side near the concave horn 2 functions as a contact edge 3e. In this modification, it is not necessary to dice the silicon substrate, and a substrate for mounting an LED chip 5 can be formed.

Figure 8A:
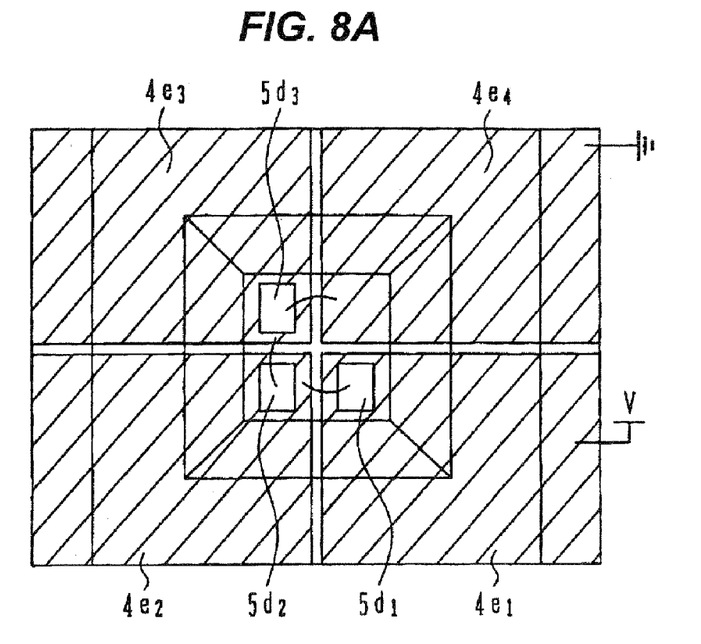
FIGS. 8A and 8B are plan views showing other examples of a mount state of an LED chip.
Figure 8B:
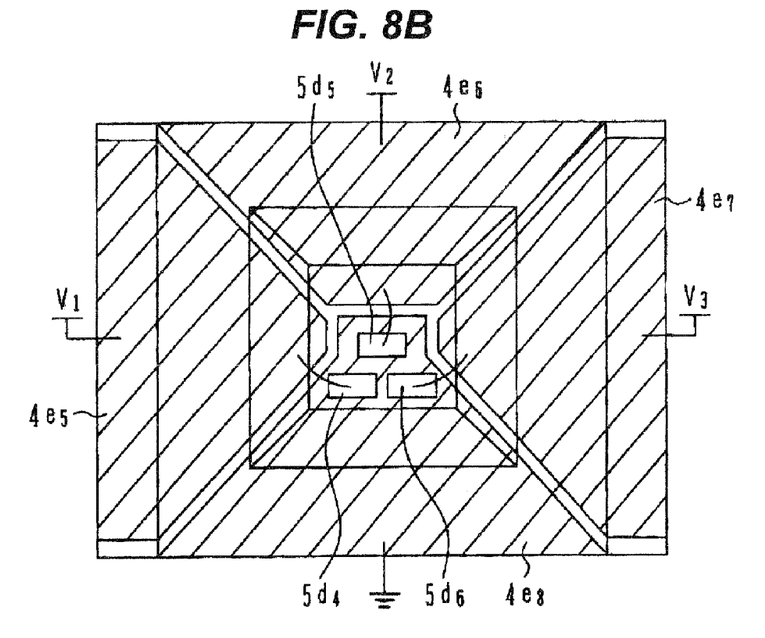

With reference to FIGS. 8A and 8B, description will be made on another example of the structure of an LED package.

An LED package may be formed which can mount LED chips providing three RGB emission colors. In this embodiment, the concave horn is formed and reflection film/electrode-layer is deposited in the manner similar to those of the first and second embodiments. The reflection film/electrode layer is patterned to allow three LED chips $5d_1$, $5d_2$ and $5d_3$ to be mounted.

As shown in FIG. 8A, the reflection film/electrode is patterned into four reflection films/electrodes $4e_1$ to $4e_4$ and the LED chips $5d_1$, $5d_2$ and $5d_3$ are mounted on the bottoms of the reflection films/electrodes $4e_1$, $4e_2$ and $4e_3$ to realize serial connection. Namely, the lower electrodes of the LED chips $5d_1$, $5d_2$ and $5d_3$ are electrically and mechanically die-bonded to the reflection films/electrodes $4e_1$, $4e_2$ and $4e_3$. Next, the upper electrodes of the LED chips $5d_1$, $5d_2$ and $5d_3$ are electrically wire-bonded to the reflection films/electrodes $4e_2$, $4e_3$ and $4e_4$. The reflection films/electrodes $4e$ and $4e_4$ are connected to an external power source lines in such a manner that forward biases are applied to the LED chips $5d_1$, $5d_2$ and $5d_3$. Similar to the first or second embodiment, resin is molded in the concave horn covering the LED chips to complete an LED package. This is a layout for three LED chips $5d_1$, $5d_2$ and $5d_3$ connected in series.

Since power is supplied to three LED chips $5d_1$, $5d_2$ and $5d_3$ simultaneously, white emission can be obtained as mixture color. There is no loss of light by the wavelength transfer phosphor material. It is possible to provide a white LED device having low loss and a high external light output efficiency.

As shown in FIG. 8B, the reflection film/electrode layer is patterned into four divided reflection films/electrodes $4e_5$ to $4e_8$, and the reflection film/electrode $4e_8$ occupying a larger part of the bottom of the concave horn is grounded. Three LED chips $5d_4$, $5d_5$ and $5d_6$ are disposed on the grounded reflection film/electrode $4e_8$, and the lower electrodes of the LED chips $5d_4$, $5d_5$ and $5d_6$ are electrically and mechanically connected to the grounded reflection film/electrode $4e_8$ by die bonding or the like.

The upper electrodes of the LED chips $5d_4$ $5d_5$ and $5d_6$ are wire bonded to the remaining reflection films/electrodes $4e_5$, $4e_6$ and $4e_7$, respectively. Similar to the first or second embodiment, resin is molded in the concave horn covering the LED chips to complete an LED package.

Voltages $V_1$, $V_2$ and $V_3$ are applied to the reflection films/electrodes $4e_5$, $4e_6$ and $4e_7$, respectively. It is possible to selectively supply power of different operation voltages to three LED chips $5d_4$ $5d_5$ and $5d_6$ to emit desired colored light. Also in this embodiment, it is possible to obtain white as mixture color of RGB emission. There is no loss of light by the wavelength transfer phosphor material. It is possible to provide a high external light output efficiency. Since voltage can be applied independently for RGB, a combination of these LED chips allows selective emission of various colors.

Figure 9A:
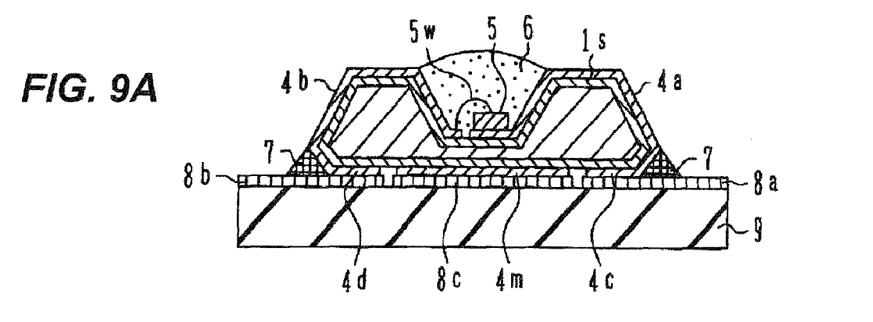
FIGS. 9A to 9C are cross sectional views showing other examples of a connection state between a silicon substrate and a circuit board.
Figure 9B:
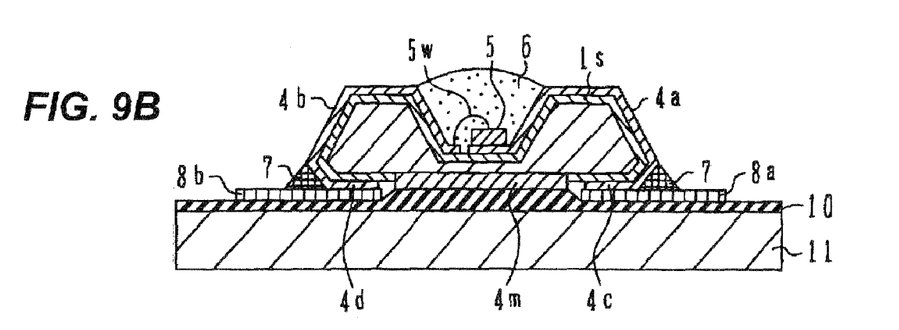
Figure 9C:
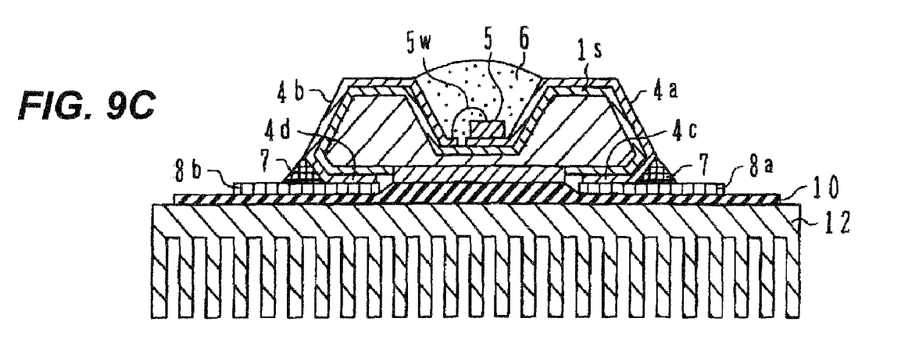

With reference to FIGS. 9A to 9C, description will be made on another embodiment of a circuit board of an LED package.

As shown in FIG. 9A, a metal film 4m is formed on the back surface of the substrate, which film is electrically independent from the electrodes. The metal film 4m is connected to a metal pattern 8c which is electrically independent from the wirings 8a and 8b on a circuit board 9. In this manner, heat generated by the LED chip 5 can be radiated efficiently from the rear side, through the bottom of the concave horn to the circuit board.

As shown in FIG. 9B, the metal film 4m for heat radiation may be formed on the back surface of the silicon substrate with the silicon oxide film 1s being removed, to thereby improve heat transfer. The metal film 4m and electrodes are connected to a heat radiation plate 11 via an insulating sheet 10.

As shown In FIG. 9C, the heat radiation plate 11 may be replaced with a heat sink 12 having radiation fins to improve the function of a heat radiation plate.

Figure 10:
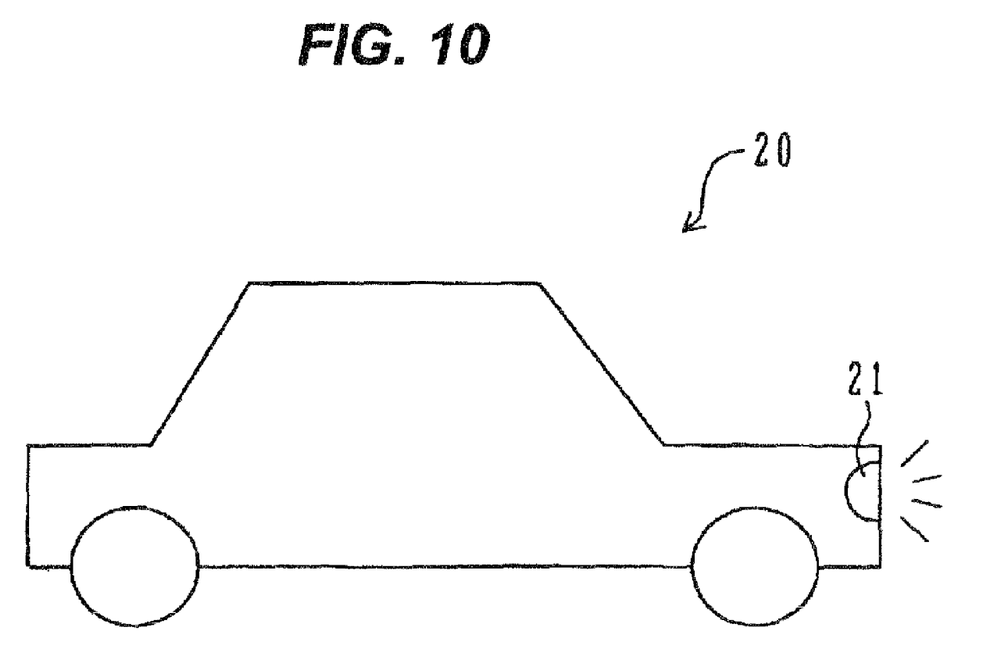
FIG. 10 is a schematic diagram showing an example of a light emitting apparatus using an LED package.

FIG. 10 is a schematic diagram of a vehicle mounted with an LED package. The LED package manufactured by the method described above can be used with various light emitting apparatus. For example, as shown in FIG. 10, the LED package is used in a headlight 21 of a vehicle 20. The LED package is also applicable to other devices such as an electronic flash, illumination and a back light.

The present invention has been described in connection with the preferred embodiments. The invention is not limited only to the above embodiments. For example, as the material of the barrier layer for the electrodes 4a to 4d, Pd, NiV, TiN, TiW, TaN, TaW and the like may be used in place of the metal described earlier. For further example, the LED chip may be connected to the silicon package by flip-chip bonding or metal wiring formed by metal film deposition and patterning (including liftoff), in place of wire bonding.

It will be apparent to those skilled in the art that other various modifications, improvements, combinations, and the like can be made.

What is claimed is:

1. A silicon package adapted for mounting an LED, comprising:
    a silicon substrate having front and back surfaces;
    a concave horn formed from the front surface to an intermediate depth in said silicon substrate, the concave horn having a bottom with a (100) plane and four inclined sidewalls with (111) planes; and
    at least one through hole or contact edge formed through said silicon substrate, outside said concave horn, the through hole or contact edge having inclined side surfaces formed of (111) planes, extending from said front and back surfaces and meeting at an intermediate height of said silicon substrate.

2. The silicon package according to claim 1, wherein a length from said intermediate height to the front surface is longer than a length from said intermediate height to the back surface.

3. The silicon package adapted for mounting an LED according to claim 1, further comprising:
   metal films deposited on the front and back surfaces of said silicon substrate including said concave horn and said through hole or contact edge.

4. The silicon package according to claim 3, wherein each of said metal films deposited on the front and back surfaces of the silicon substrate is divided into a plurality of regions.

5. A method for manufacturing the silicon package of claim 1, comprising:
   (a) preparing the (100) silicon substrate so as to have insulating films formed on the front and back surfaces of said silicon substrate;
   (b) forming resist patterns on said insulating films and partially etching said insulating films to form etching masks on the front and back surfaces, the etching mask on the front surface having a rectangular aperture defined by sides along [110] directions of said silicon substrate for forming the concave horn and a first shaped aperture defined by sides along [110] directions of said silicon substrate for forming the through hole or the contact edge, the etching mask on the back surface having a second shaped aperture defined by sides along [110] directions of said silicon substrate for forming the through hole or contact aperture, registered with the first shaped aperture; and
   (c) subjecting said silicon substrate to anisotropic etching dependent upon crystallographic orientation to form the concave horn and the through hole or contact edge.

6. The method for manufacturing the silicon package according to claim 5, wherein:
   when (b) forming said etching masks on the front and back surfaces, the first shaped aperture on the front surface is made larger than the second shaped aperture on the back surface; and
   when (c) forming the concave horn and the through hole or contact edge, a length from said intermediate height to the front surface is longer than a length from said intermediate height to the back surface.

7. The method for manufacturing the silicon package according to claim 5, further comprising:
   (d) dicing said silicon substrate through said through hole or contact edge, after (c) forming the concave horn and the through hole or contact edge.

8. An LED package comprising:
   a silicon substrate having front and back surfaces;
   a concave horn formed from the front surface to an intermediate depth in said silicon substrate, the concave horn having a bottom with a (100) plane and four inclined sidewalls with (111) planes;
   at least one through hole or contact edge formed through said silicon substrate, outside said concave horn, the through hole or contact edge having inclined side surfaces formed of (111) planes, extending from said front and back surfaces and meeting at an intermediate height of said silicon substrate; and
   at least one LED chip mounted on the bottom of said concave horn.

9. The LED package according to claim 8, further comprising:
   metal films deposited on the front and back surfaces of the substrate, meeting at the intermediate height in said through hole or contact edge,
   wherein said at least one LED is mounted on one of the metal films, formed on the front surface of the substrate at the bottom of said concave horn.

10. The LED package according to claim 9, wherein the metal film formed on the concave horn includes an uppermost reflective layer, serving as electrode and reflection mirror.

11. The LED package according to claim 9, wherein each of said metal films deposited on the front and back surfaces of the silicon substrate is divided into a plurality of regions, each of said plurality of regions of the metal film deposited on the front surface extending into said concave horn, and said at least one LED is mounted on one of the plurality of regions of the metal film deposited on the front surface at the bottom of said concave horn.

12. The LED package according to claim 9, wherein said at least one LED comprises three LEDs, and each of said three LEDs has a top electrode and a bottom electrode.

13. The LED package according to claim 12, wherein the metal film deposited on the front surface of the silicon substrate is divide into four regions and said three LEDs are mounted on three of said four regions, and are connected in series.

14. The LED package according to claim 12, wherein the metal film deposited on the front surface of the silicon substrate is divide into four regions and said three LEDs are mounted on one of said four regions, and are connected in parallel.

15. The LED package according to claim 9, wherein the metal film-deposited on the front surface of the substrate includes a base layer made of one of Pd, Pt, Ni, NiV, Cu, Ti, TiN, TiW, TaN and TaW, and a top layer made of one of Ag, Au, Al and alloy thereof.

16. A method for manufacturing the LED package of claim 11, comprising:
   (a) preparing the (100) silicon substrate so as to have insulating films formed on the front and back surfaces of said silicon substrate;
   (b) forming resist patterns on said insulating films and partially etching said insulating films to form etching masks on the front and back surfaces, the etching mask on the front surface having a rectangular aperture defined by sides along [110] directions of said silicon substrate for forming the concave horn and a first shaped aperture defined by sides along [110] directions of said silicon substrate for forming the through hole or the contact edge, the etching mask on the back surface having a second shaped aperture defined by sides along [110] directions of said silicon substrate for forming the through hole or contact aperture, registered with the first shaped aperture;
   (c) subjecting said silicon substrate to anisotropic etching dependent upon crystallographic orientation to form the concave horn and the through hole or contact edge;
   (d) depositing metal films on the front and back surfaces of said silicon substrate including said concave horn and said through hole or contact edge; and
   (e) mounting an LED chip on said metal film at the bottom of said concave horn.

17. The method for manufacturing the LED package according to claim 16, wherein:
   when (b) forming the etching masks on the front and back surfaces, the first shaped aperture on the front surface is made larger than the second shaped aperture on the back surface; and when (c) forming the concave horn and the through hole or contact edge, a length from said intermediate height to the front surface is longer than a length from said intermediate height to the back surface.

18. The method for manufacturing the LED package according to claim 16, further comprising:
   (d) dicing said silicon substrate through said through hole or contact edge, after (c) forming the concave horn and the through hole or contact edge.

19. A lighting apparatus including an LED package, the LED package comprising:
   a silicon substrate having front and back surfaces;
   a concave horn formed from the front surface to an intermediate depth in said silicon substrate, the concave horn having a bottom with a (100) plane and four inclined sidewalls with (111) planes;
   at least one through hole or contact edge formed through said silicon substrate, outside said concave horn, the through hole or contact edge having inclined side surfaces formed of (111) planes, extending from said front and back surfaces and meeting at an intermediate height of said silicon substrate; and
   at least one LED chip mounted on the bottom of said concave horn.

20. The lighting apparatus according to claim 19, wherein the lighting apparatus constitutes a head lamp of an automobile vehicle, emitting white light.

* * * * *